(12) United States Patent
Xun et al.

(10) Patent No.: US 9,755,659 B2
(45) Date of Patent: Sep. 5, 2017

(54) ASAR ADC CIRCUIT AND CONVERSION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Ben Peng Xun, Shanghai (CN); Fei Liu, Shanghai (CN); Meng Meng Guo, Shanghai (CN); Hua Tang, Shanghai (CN); Haifeng Yang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/407,334

(22) Filed: Jan. 17, 2017

(65) Prior Publication Data

US 2017/0222654 A1 Aug. 3, 2017

(30) Foreign Application Priority Data

Feb. 3, 2016 (CN) .......................... 2016 1 0079630

(51) Int. Cl.
*H03M 1/38* (2006.01)
*H03M 1/12* (2006.01)
*H03M 1/44* (2006.01)
*H03M 1/42* (2006.01)

(52) U.S. Cl.
CPC ............. *H03M 1/125* (2013.01); *H03M 1/38* (2013.01); *H03M 1/42* (2013.01); *H03M 1/44* (2013.01)

(58) Field of Classification Search
CPC .......... H03M 1/125; H03M 1/42; H03M 1/44; H03M 1/38
USPC .................................................. 341/161, 155
See application file for complete search history.

(56) References Cited

U.S. PATENT DOCUMENTS

| | | | |
|---|---|---|---|
| 9,584,144 B1 * | 2/2017 | Zhou | H03K 5/15026 |
| 9,621,179 B1 * | 4/2017 | Maulik | H03M 1/466 |
| 9,660,664 B1 * | 5/2017 | Price | H03M 1/462 |
| 2014/0022105 A1 | 1/2014 | Chen et al. | |

(Continued)

*Primary Examiner* — Brian Young
(74) *Attorney, Agent, or Firm* — Anova Law Group, PLLC

(57) ABSTRACT

The present disclosure provides asynchronous successive approximation register analog-to-digital converter (ASAR ADC) circuits and signal conversion method thereof. An exemplary ASAR AC circuit includes a sample/hold circuit configured to input a first analog signal and output a second analog signal; a digital-to-analog converter circuit configured to output a third analog signal; a first voltage comparison circuit configured to respond to a valid level of a latch signal, and output a first logic level and a second logic level; a first logic circuit configured to respond to a valid level of a flag signal, and identify a comparison result of the first voltage comparison circuit and output the first digit signal; and a pulse generation circuit configured to generate the latch signal and the flag signal with a generation time of the valid levels independently from the first logic level and the second logic level.

20 Claims, 7 Drawing Sheets

(56) References Cited

U.S. PATENT DOCUMENTS

2014/0145868 A1 5/2014 Sugimoto et al.
2015/0270846 A1 9/2015 Deguchi et al.

* cited by examiner

ASAR ADC CIRCUIT AND CONVERSION METHOD THEREOF

CROSS-REFERENCES TO RELATED APPLICATIONS

This application claims the priority of Chinese patent application No. 201610079630.1, filed on Feb. 3, 2016, the entirety of which is incorporated herein by reference.

FIELD OF THE INVENTION

The present invention generally relates to the field of electronic technology and, more particularly, relates to asynchronous successive approximation register analog-to-digital converter (ASAR ADC) circuits; and analog-to-digital conversion methods thereof.

BACKGROUND

Among the analog-to-digital converters (ADCs), successive approximation register analog-to-digital converters (SAR ADCs) are the commonly used ADCs. The conversion process of the SRA ADCs is analogous to measuring weight by a balance. The SAR ADC compares the input analog signal with the different reference voltages for a few times to cause the obtained digital value to successively approach the input analog value. The reference voltages are often generated by a digital-to-analog convertor (DAC). The SAR ADCs include synchronous successive approximation register analog-to-digital converters (SSAR ADCs) and asynchronous successive approximation register analog-to-digital converters (ASAR ADCs). The SSAR ADC compares the input analog signal with the reference voltage one time in one period. Comparing with the SSAR ADCs, the ASAR ADCs have a different control logic. The ASAR ADCs are able to finish all comparisons between the input analog signal and the reference voltages in one period. Thus, the ASAR ADCs have a higher conversion speed.

FIG. 1 illustrates a circuit diagram of an existing ASAR ADC 10. The ASAR ADC 10 includes a sample/hold circuit 101, a comparison circuit 103, an Exclusive-OR gate circuit 104, an ASAR logic circuit 105 and a DAC circuit 102. The input signal "$V_{in}$" is connected to the first input terminal of the comparison circuit 103 through the sample/hold circuit 101. The output voltage "$V_{comp}$" of the comparison circuit 103 is connected to the Exclusive-OR gate circuit 104 and the ASAR logic circuit 105. The output terminal of the Exclusive-OR gate circuit 104 is connected to the ASAR logic circuit 105. The ASAR logic circuit 105 performs a logic calculation according to the input signal "$V_{in}$"; and the digital output signal "$V_{out}$" is obtained as an output signal. The output signal is used as a control signal; and is transferred into the input terminal of the DAC circuit 102. The output signal of the DAC circuit 102 is transmitted to the second input terminal of the comparison circuit 103. The comparison circuit 103 responds to the "Latch" signal, and compares the input signals. When the comparison is finished, the "Flag" signal outputted by the Exclusive-OR gate circuit 104 becomes a valid signal; and is identified by the ASAR logic circuit 105. The ASAR logic circuit 105 controls the comparison circuit 103 to start a next comparison process.

However, the comparison circuit of the existing ASAR ADC has a metastable issue. The metastable issue affects the performance of the ASAR ADCs, including the effective digits, etc. Accordingly, the applications of the ASAR ADCs are limited. The disclosed circuit structures and methods are directed to solve one or more problems set forth above and other problems in the art.

BRIEF SUMMARY OF THE DISCLOSURE

One aspect of the present disclosure includes an asynchronous successive approximation register analog-to-digital converter (ASAR ADC) circuit, configured to covert a first analog signal into a first digital signal. The ASAR ADC circuit includes a sample/hold circuit having an input terminal configured as an input terminal of the ASAR ADC to input the first analog signal, and an output terminal configured to output a second analog signal; a digital-to-analog converter circuit having an input terminal configured to input the first digital signal, and an output terminal configured to output a third analog signal; a first voltage comparison circuit, configured to respond to a valid level of a latch signal, and to compare the second analog signal with the third analog signal respectively inputted into a positive terminal of the first voltage comparison circuit and a negative terminal of the first voltage comparison circuit to output a first logic level and a second logic level; a first logic circuit, configured to respond to a valid level of a flag signal, and to identify a comparison result of the first voltage comparison circuit according to the first logic level and the second logic level respectively inputted into the first logic circuit to output the first digit signal; and a pulse generation circuit configured to generate the latch signal and the flag signal with a generation time of the valid levels of the latch signal and the flag signal independently from the first logic level and the second logic level.

Another aspect of the present disclosure includes an analog-to-digital conversation method using an asynchronous successive approximation register analog-to-digital converter (ASAR ADC) circuit having a sample/hold circuit, an digital-to-analog convertor circuit, a first voltage comparison circuit, a first logic circuit and a pulse generation circuit. The analog-to-digital conversion method includes inputting a first analog signal into the sample/hold circuit and outputting a second analog signal; inputting a first digital signal into the digital-to-analog converter circuit and outputting a third analog signal; responding to a valid level of a latch signal, and comparing the second analog signal and the third analog signal using the first voltage comparison circuit to output a first logic level and a second logic level; responding to a valid level of a flag signal, and identifying a comparison result of the first voltage comparison circuit according to the first logic level and the second logic level using the first logic circuit and outputting a first digital signal; and generating the latch signal and the flag signal using the pulse generation circuit with a generation time of the valid levels of the latch signal and the flag signal being independent of the first logic level and the second logic level.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 2:
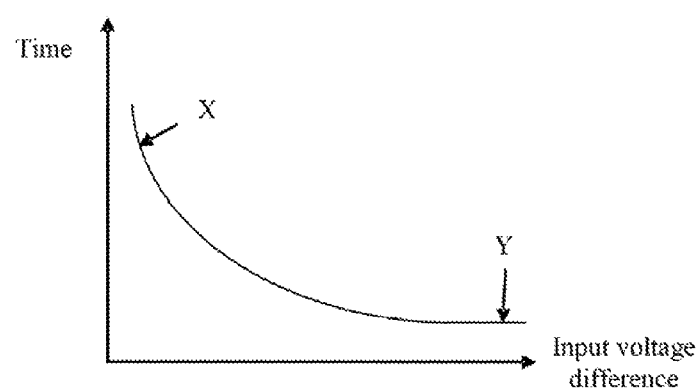
FIG. 2 illustrates a process for the comparison circuit of the existing ASAR ADC to compare correlation between time and input voltage difference.

The existing ASAR ADC circuits have the metastable issue in the comparison circuit. Specifically, in the existing ASAR ADC circuit, the comparison circuit has a metastable issue. FIG. 2 illustrates a process for the comparison circuit of the existing ASAR ADC to compare the correlation between time and the input voltage difference.

As shown in FIG. 2, when the voltage difference at the input terminals of comparison circuit is substantially small (Point X), it takes longer for the comparison circuit to obtain a correct comparison result. When the voltage difference at the input terminals of comparison circuit is significantly large (Point Y), the time for comparison circuit to obtain a correct comparison result is stabilized at a minimum device delay time.

Figure 1:
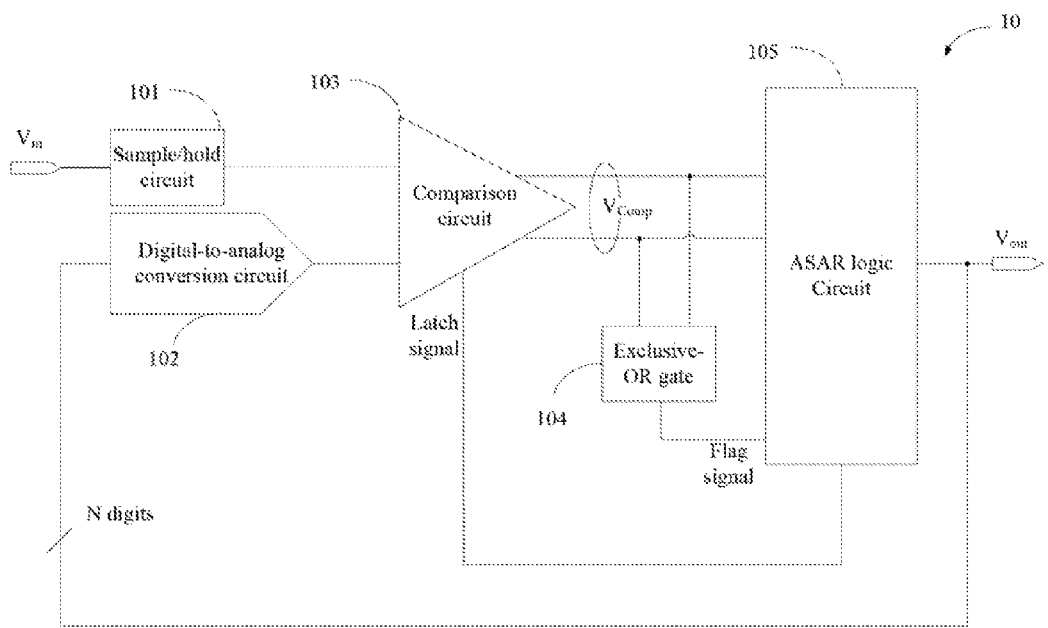
FIG. 1 illustrates a circuit diagram of an existing ASAR ADC.
Figure 3:
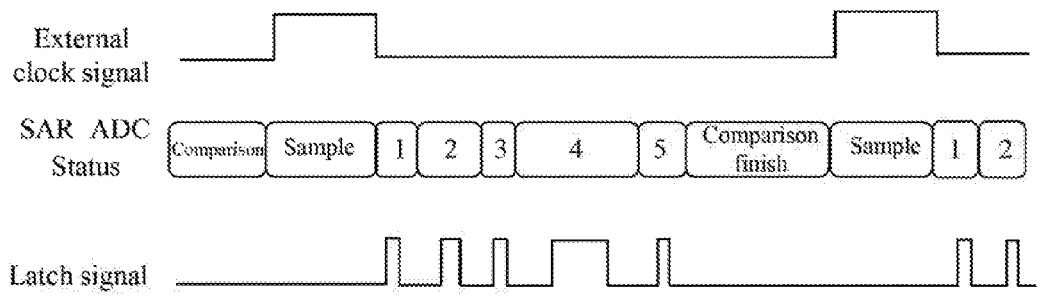
FIG. 3 illustrates a correlation between an internal status of the ASAR ADC and an external clock signal.

FIG. 3 illustrates the correlation between the internal status of a five-digit ASAR ADC circuit illustrated in FIG. 1 and the external clock signal. As shown in FIG. 3, the comparison circuit of the SSAR ADC circuit compares one time under the effective-edge of each external clock signal. The ASAR ADC circuit utilizes an internal detection circuit. When the detection circuit detects that the comparison circuit has finished one comparison process, the ASAR ADC enters into a next comparison process to a next digit right away. A parallel output result is provided until all comparison processes are finished.

Therefore, for a five-digit SSAR ADC circuit, the SSAR ADC circuit needs at least six external clock signal periods including the sampling to output the comparison result. However, the ASAR ADC needs one external clock signal period to finish the sampling and the comparison processes of all digits; and is able to finish all the comparison processes before the next external clock signal period.

However, the metastable issue of the comparison circuit limits the applications of the ASAR ADCs. In all the comparison processes of an external clock signal period, if the difference of the input signals of the comparison circuit is substantially small, and a relatively large amount of time is spend on a certain digit, the subsequent comparison processes are unable to be finished in the clock signal period.

The ASAR ADC may generate a relatively large error. Thus, the performances of the ASAR ADC, such as the effective digits, etc., may be affected.

To solve the metastable issue of the comparison circuit, an approach named as "metastable-then-set" has been used. Specifically, a metastable detection circuit 201 is included in the ASAR ADC 10 illustrated in FIG. 1; and an ASAR ADC 20 is formed.

Figure 4:
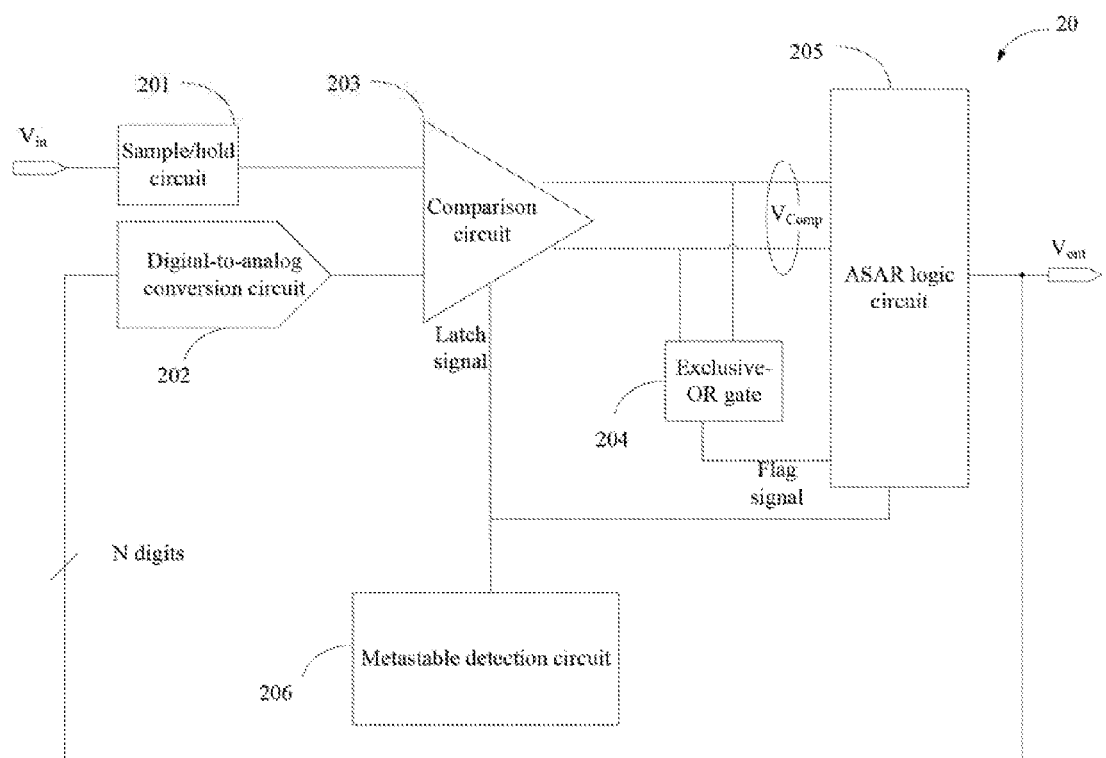
FIG. 4 illustrates a circuit diagram of another existing ASAR ADC.

FIG. 4 illustrates a corresponding ASAR ADC 20. As shown FIG. 4, in the ASAR ADC 20, the sample/hold circuit 201, the comparison circuit 203, the Exclusive-OR gate circuit 204, the ASAR logic circuit 205 and the DAC circuit 202 are similar to those in the ASAR ADC 10 illustrated in FIG. 1.

The metastable detection circuit 206 detects the time "t" between the raising-edge of the latch signal (Latch) and the raising-edge of the flag signal (Flag), i.e., the comparison time of the comparison circuit 203. If "t" is greater than a certain preset value, the comparison circuit 203 is determined to be at a metastable status in the current comparison process. If "t" is smaller than the preset value, the comparison circuit 203 is determined to be at a stable status.

When the comparison circuit 203 is detected to be at the metastable status, the comparison process is terminated right away. At the same time, the subsequent comparison logic is set to be 10000 for a five-digit ADC. Because the comparison circuit 203 is at the metastable status, the difference between the input signals is relatively small. Thus, setting the compared signals to be 10000 may not significantly affect the output resolution of the ADC; and the comparison circuit 203 may not waste too much time at the metastable status.

Although the existing ASAR ADC may be able to solve the metastable issue of the comparison circuit, its logic is relatively complex.

The present disclosure provides an improved ASAR ADC circuit and an analog-to-digital conversion method. The disclosed ASAR ADC may be easy to realize; and the production cost may be relatively low. A pulse generation circuit may be disposed in the ASAR ADC. The pulse generation circuit may be configured to generate a latch signal and a flag signal. By setting the time for generating the valid levels of the latch signal and the flag signal to be independent of the comparison result of the first voltage comparison circuit, when the first voltage comparison circuit finds a metastable state during a comparison process, the pulse generation circuit may control the generation sequence of the latch signal and the flag signal to actively intervene with the first voltage comparison circuit to stop the comparison process. Thus, the resolutions issue of the ASAR ADC caused by the metastable state of the first voltage comparison circuit may be effectively solved.

Figure 5:
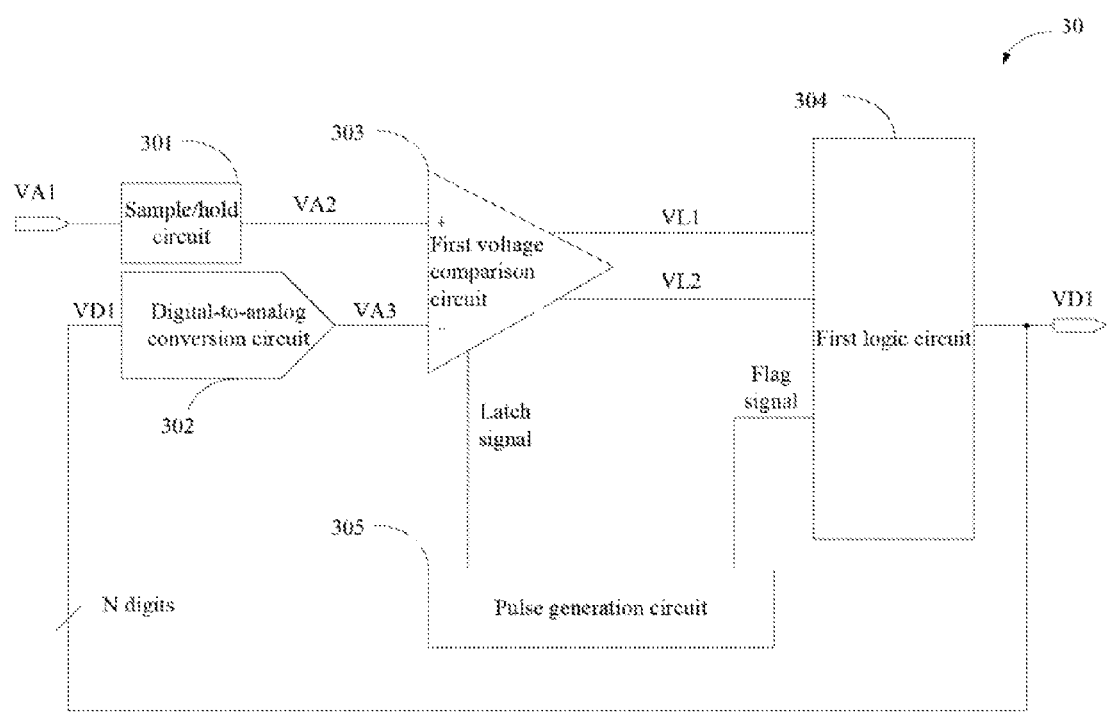
FIG. 5 illustrates a block diagram of an exemplary ASAR ADC consistent with the disclosed embodiments.

FIG. 5 illustrates an exemplary ASAR ADC circuit 30 consistent with the disclosed embodiments. The ASAR ADC may be used to convert a first analog signal "VA1" to a first digital signal "VD1"; and output the first digital signal "VD1".

As shown in FIG. 5, the ASAR ADC circuit 30 may include a sample/hold circuit 301, a DAC circuit 302, a first voltage comparison circuit 303, a first logic circuit 304 and a pulse generation circuit 305.

The input terminal of the sample/hold circuit 301 may be configured as the input terminal of the ASAR ADC circuit 30 to input the first analog signal "VA1". The output terminal of the sample/hold circuit 301 may be connected to the positive input terminal of the first voltage comparison circuit 303; and may output a second analog signal "VA2". That is, the second analog signal "VA2" may be inputted into the positive input terminal of the first voltage comparison circuit 303.

The input terminal of the DAC circuit 302 may be configured to input the first digital signal "AD1". The output terminal of the DAC circuit 302 may be connected to the negative input terminal of the first voltage comparison circuit 303; and may be configured to output a third analog signal "VA3". That is, the third analog signal "VA3" may be inputted into the negative input terminal of the first voltage comparison circuit 303.

Thus, the second analog signal "VA2" and the third analog signal "VA3" may be inputted into the positive input terminal and the negative input terminal of the first voltage comparison circuit 303, respectively. The first voltage comparison circuit 303 may respond to a valid level of a "Latch" signal. The first voltage comparison circuit 303 may compare the second analog signal "VA2" and the third analog signal "VA3"; and may output a first logic signal "VL1" and a second logic signal "VL2".

The first logic signal "VL1" and the second logic signal "VL2" may be inputted into the first logic circuit 304. The first logic circuit 304 may respond to the valid level of the 'Flag" signal. The first logic circuit 304 may identify the comparison result of the first voltage comparison circuit 303 according to the first logic signal "VL1" and the second logic signal "VL2"; and output the first digital signal "VD1".

The pulse generation circuit 305 may be configured to generate the "Latch" signal and the "Flag" signal. The time for generating the valid levels of the "Latch" signal and the "Flag" signal may be independent of the first logic signal "VL1" and the second logic signal "VL2". That is, the time for generating the valid levels of the "Latch" signal and the "Flag" signal may not correlated to the first logic signal "VL1" and the second logic signal "VL2".

The first voltage comparison circuit 303 may often include a switching capacitor (not shown); and may respond to the raising-edge of the "Latch" signal. When the "Latch" signal is at a low level, the first voltage comparison circuit 303 may be at a reset status. The first logic signal "VL1" and the second logic signal "VL2" outputted from the first voltage comparison circuit 303 may all be at a logic high level. When the "Latch" signal is at a high level, the reset status of the first voltage comparison circuit may be released; and one of the first logic signal "VL1" and the second logic signal "VL2" may be at a logic high level, and the other may be at a logic low level. The first logic circuit 304 may further analyze the comparison result of the first voltage comparison circuit 203 according to which one of the first logic signal "VL1" and the second logic signal "VL2" is at the logic high level and which one of the first logic signal "VL1" and the second logic signal "VL2" is at the logic low level.

Further, when one of the first logic signal "VL1" and the second logic signal "VL2" is at the logic high level and the other one of the first logic signal "VL1" and the second logic signal "VL2" is at the logic low level, the output of the "Flag" signal may be a valid level (often is a high level); and the "Flag" signal with the valid level may be inputted into the first logic circuit 304.

Specifically, in one embodiment, the sample/hold circuit 301 may include pure resistor-type of ADC circuit (not shown), resistor-capacitor type of ADC circuit (not shown) or pure capacitor type of ADC circuit. The first voltage comparison circuit 303 may include fully differential input/fully differential output comparison circuit (not shown). The first logic circuit 304 may include a register, an external signal generation unit (not shown), and a control logic unit (not shown), etc.

The external signal generation unit of the first logic circuit 304 may be configured to generate an external clock signal. Based on the digits of the ADC, the structure of the control logic unit and the number of the registers in the first logic circuit 304 may be different.

The working mechanism of the first logic circuit 304 may be as follows. Before staring the analog-to-digit conversion, all the registers may be reset to zero. After the analog-to-digit conversion is started, the external clock signal may set the highest bit of the register to be 1; and the output digit number may be 100 . . . 0. Such a digit number may be converted into a corresponding analog voltage by the DAC circuit 302; and transmitted to the first voltage comparison circuit 303; and may be used as the third analog signal "VA3" to compare with the second analog signal "VA2". If the analog voltage converted by the DAC 302 corresponding to the digit number (i.e. the third analog signal "VA3") is greater than the second analog signal "VA2", the digital number may be over sized; and "1" in the highest digit may be cleared. If the analog voltage converted by the DAC 302 corresponding the digit number (i.e. the third analog signal "VA3") is smaller than greater than the second analog signal "VA2", the digit number may not be large enough, "1" in the highest digit may be kept. Then, the digit next to the highest digit may be set as "1", and "I" may be determined to keep or clear by a similar comparison process. All the digits may be successively compared until the lowest digit is set. After the comparison processes, the status of the register may be the required digit output, i.e. a digital number having N digits. Thus, the conversion process of the SAR ADC circuit may be analogous to the process for a balance to measure an object with an unknown weight, but the weights are half one by one.

Figure 6:
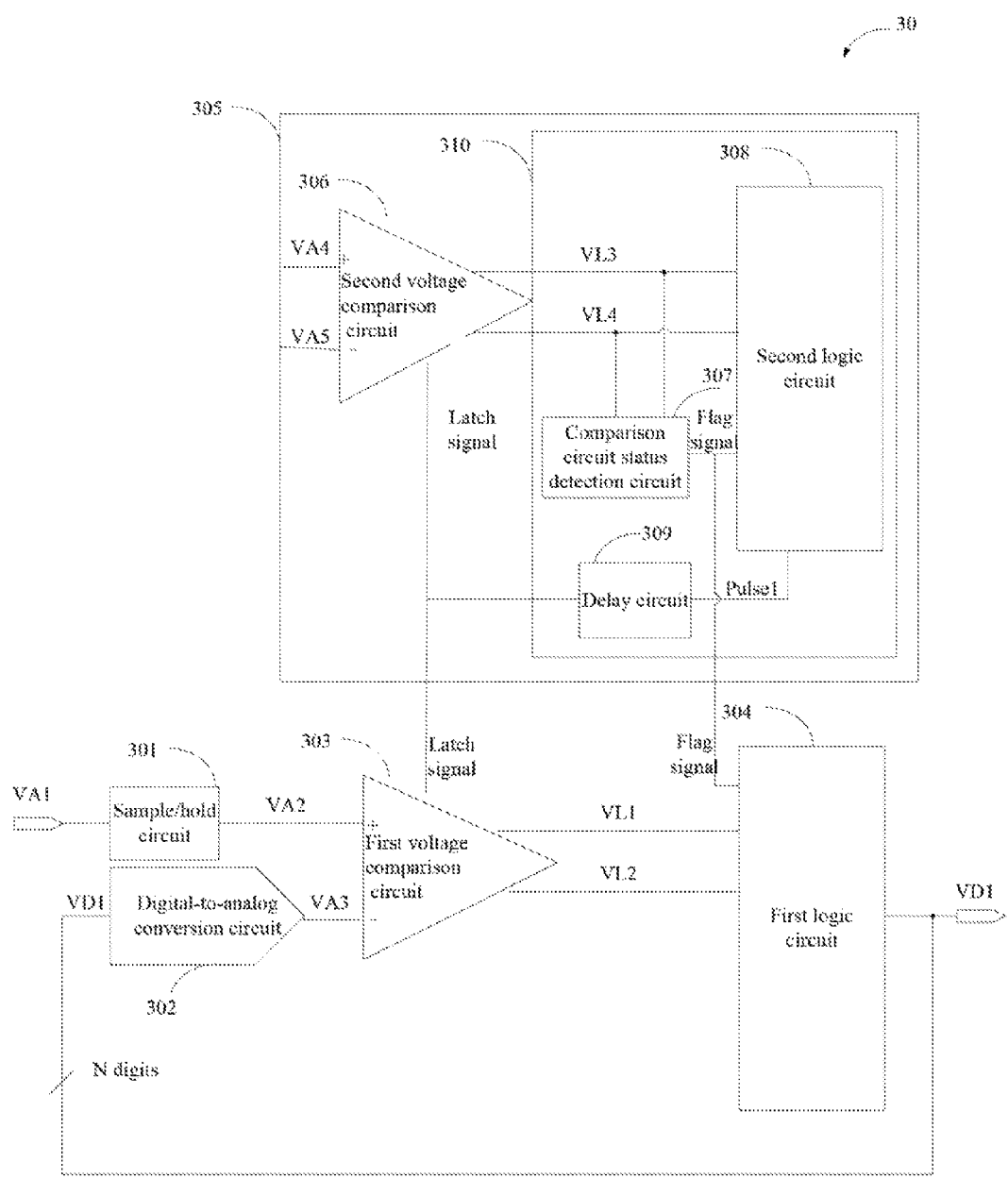
FIG. 6 illustrates a block diagram of another exemplary ASAR ADC consistent with the disclosed embodiments.

As shown in FIG. 6, the pulse signal generation circuit 305 may include a second voltage comparison circuit 306; and a signal generation circuit 310. The signal generation circuit 310 may be configured to generate the "Latch" signal and the "Flag" signal.

The positive input terminal and the negative input terminal of the second voltage comparison circuit 306 may be configured to input a fourth analog signal "VA4" and a fifth analog signal "VA5", respectively; and respond to the "Latch" signal. The second voltage comparison circuit 306 may compare the fourth analog signal "VA4" with the fifth analog signal "VA5"; and output a third logic level "VL3" and a fourth logic level "VL4".

The signal generation circuit 310 may identify the third logic level "VL3" and the fourth logic level "VL4"; and determine if the second voltage comparison circuit 306 finishes a comparison process according to the identification results. When the comparison process is finished, the "Flag" signal may change to a valid level. The signal generation circuit 310 may identify the comparison result of the second voltage comparison circuit 306 when the second voltage comparison circuit 302 finishes the comparison process.

The sum of the time for the signal generation circuit 310 to identify whether the second voltage comparison circuit 306 finishes the comparison process and the time for the signal generation circuit 310 to identify the comparison result of the second voltage comparison circuit 306 may be referred to as a first delay time.

The "Latch" signal may be a pulse signal. The pulse width of the "Latch" signal may be equal to a sum of a preset second delay time and the first delay time.

In one embodiment, under the stable status comparison, the comparison delay of the second voltage comparison circuit 306 may be within a pre-set error range of the comparison delay of the first voltage comparison circuit 303. In a specific embodiment, the amplitude of the fourth analog signal "VA4" may be equal to the amplitude of a power source. The amplitude of the fifth analog signal "VA5" may be equal one half of the amplitude of the power source.

As described above, the voltage comparison circuit may have a metastable issue. When the voltage comparison circuit is at a status opposite to the metastable status, the voltage comparison circuit may be at a stable status. Whether the voltage comparison circuit is at a stable status may be dependent of the minimum input voltage difference, the circuit fabrication process, and the circuit structures, etc. In the disclosed embodiments, to cause the second voltage comparison circuit 306 to be at a stable status during the comparison process, "big signals" may be inputted into the input terminals of the second voltage comparison circuit 306. Usually, when the input signal difference of the voltage comparison circuit 306 is greater than approximately 1 mV, the voltage comparison circuit 306 may not enter into the metastable status.

Further, as shown in FIG. 6, in one embodiment, the signal generation circuit 310 may include a comparison circuit status detection circuit 307, a second logic circuit 308 and a delay circuit 309.

The comparison circuit detection circuit 307 may be configured to identify the third logic level "VL3" and the fourth logic level "VL4"; and determine whether the second voltage comparison circuit 306 finishes the comparison process according to the identification result. When the comparison process is finished, the "Flag" signal may become a valid level.

The second logic circuit 308 may identify the comparison result of the second voltage comparison circuit 306 when the second voltage comparison circuit 306 finishes the comparison process. When the identification process is finished, the second logic circuit 308 may output a first pulse signal "Pulse1".

The delay circuit 309 may be configured to provide a second delay time to the first pulse signal "Pulse1"; and output the "Latch" signal.

The comparison circuit status detection circuit 307 may be configured to detect whether the second voltage comparison circuit 306 finishes the comparison process. In a specific embodiment, when the second voltage comparison circuit 306 finishes the comparison process, a logic high level and a logic low level may be outputted. Thus, in one embodiment, the comparison circuit status detection circuit 307 may be an Exclusive-OR gate circuit. If the third logic level "VL3" and the fourth logic level "VL4" are opposite, the "Flag" signal may be a logic high level.

In some embodiments, the comparison circuit status detection circuit 307 may be other appropriate logic circuits, or a combination of the logic circuits, etc. As long as the corresponding logic functions are able to be finished. The comparison status detection circuit 307 may not be limited.

In one embodiment, the signals inputted into the second voltage comparison circuit 306 may all be the "big signals", i.e., may be the voltage of the power source and one half of the voltage of the power source. Such "big signals" may cause the comparison of the second voltage comparison circuit 306 to be always at a stable status. Further, in the disclosed embodiments, the comparison delay of the second voltage comparison circuit 306 may be set within the preset error range of the comparison delay of the first voltage comparison circuit 303, it may further limit the maximum comparison time of the first voltage comparison circuit 303 to be within the preset error range for comparing the "big signals". On one hand, the first voltage comparison circuit 303 may be able to finish the comparison of the "big signals". On the other hand, the inputted small signals may not be left with excessive comparison time. At the same time, the output precision and the conversion speed of the ASAR ADC 30 may be balanced.

In one embodiment, the delay circuit 309 may include at least one cascade-connected inverter (not shown). Further, for the consideration of a circuit logic, the delay circuit 309 may include an even number of cascade-connected inverters. Further, the delay circuit 309 may be realized by hardware circuits. The delay circuit 309 may also be setup a timer in software. For example, the second delay time may be disposed in the second logic circuit 308.

In one embodiment, the pulse width of the "Latch" signal may be equal to a sum of a preset second delay time and the first delay time. The first delay time may be the sum of the time for the signal generation circuit 310 to identify whether the second voltage comparison circuit 306 finishes the comparison process and the time for the signal generation circuit 310 to identify the comparison result of the second voltage comparison circuit 306. By setting the second delay time through the delay circuit 309, the time sequence of the "Latch" signal may be flexibly controlled so as to actively intervene the maximum comparison time of the first voltage comparison circuit 303.

In one embodiment, the internal structure of the second voltage comparison circuit 306 may be identical to the internal structure of the first voltage comparison circuit 303. The second voltage comparison circuit 306 and the first voltage comparison circuit 303 may be formed by similar fabrication processes; and may be from a same manufacturing batch. In one embodiment, the internal structure of the second logic circuit 308 may be identical to the internal structure of the first logic circuit 304. On one hand, the disclosed embodiments may be easy to realize; and the production cost may be reduced. On the other hand, from the control time sequence and the delay time points of view, the synchronization of the disclosed ASAR ADC circuit 30 may be ensured.

Figure 7:
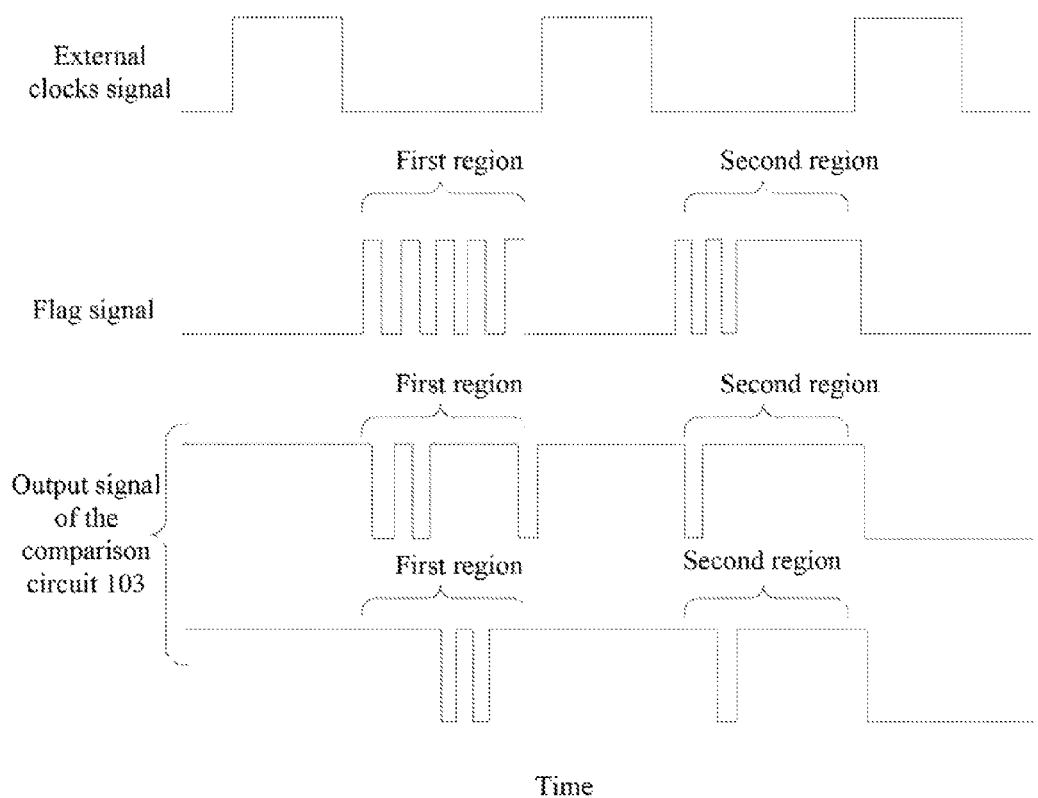
FIG. 7 illustrates simulation results of the external clock signal, latch signal and output signal of the comparison circuit of an existing ASAR ADC.
Figure 8:
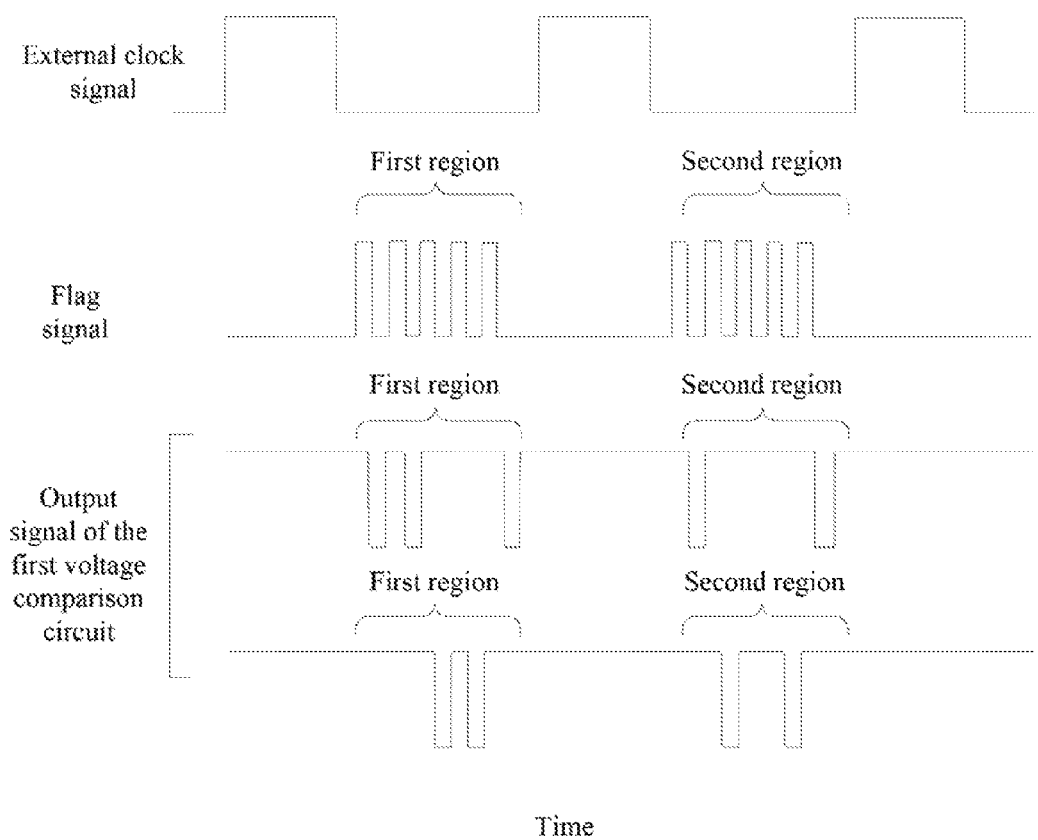
FIG. 8 illustrates simulation results of an external clock signal, a latch signal and an output signal of the first voltage comparison circuit of an exemplary ASAR ADC consistent with the disclosed embodiments.

FIG. 7 illustrates simulation results of the external clock signal, the "Latch" signal and the output signal of the comparison circuit 103 of the existing ASAR ADC circuit 10 (illustrated in FIG. 1). FIG. 8 illustrates the simulation results of the external clock signal, the "Latch" signal and the output signal of the first voltage comparison circuit 303 of the exemplary ASAR ADC circuit 30 consistent with the disclosed embodiments (illustrated in FIG. 5).

As shown FIG. 7 and FIG. 8, for a five-digit ADC, under a same external clock signal, when big signals are inputted the comparison circuit 103 and the comparison circuit 303 (corresponding to the first region illustrated in FIG. 7 and the first region illustrated in FIG. 8), the comparison circuit 103 of the existing ASAR ADC circuit 10 and the comparison circuit 303 of the disclosed ASAS ADC circuit 30 may all be able to finish the comparison process; and they may all be at the stable status. However, when small signals are inputted in the comparison circuit 103 and the comparison circuit 303, the comparison circuit 103 of the existing ASAR ADC circuit 10 may enter into the metastable status, the uncomplete comparison issue of the comparison circuit 103 may occur. Comparing with the comparison circuit 103 of the existing ASAR ADC circuit 10, the first voltage comparison circuit 303 of the disclosed ASAR ADC circuit 30 may be able to almost entirely finish the comparison process; and may not have the uncomplete comparison issue.

Figure 9:
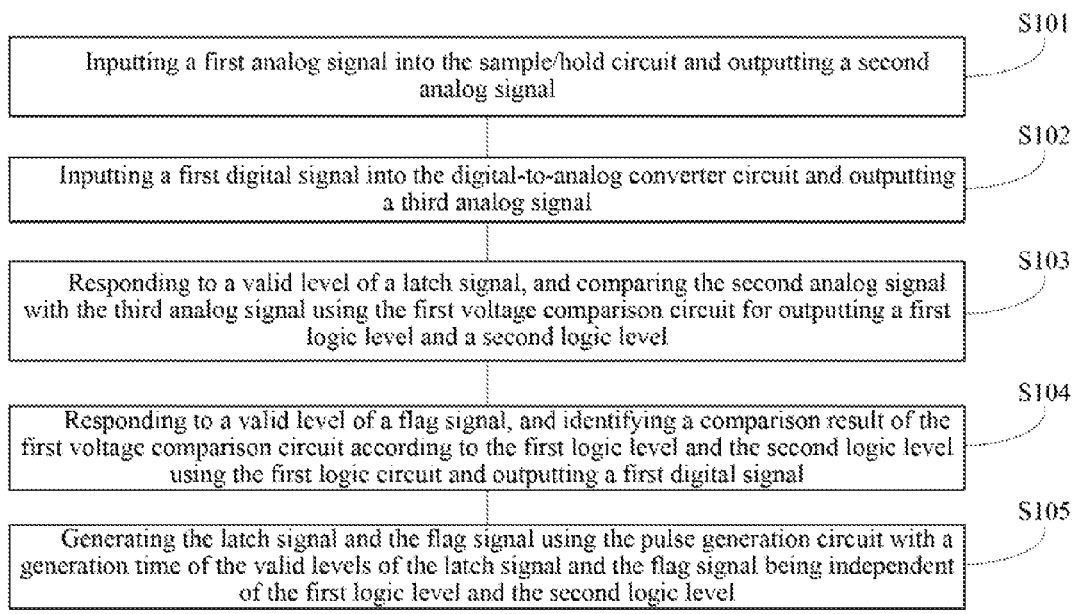
FIG. 9 illustrates an exemplary analog-to-digital conversion process using an ASAR ADC circuit consistent with the disclosed embodiments.

Thus, an analog-to-digital conversion method using the disclosed ASAR ADC circuit is provided. FIG. 9 illustrates an exemplary analog-to-digital conversion method consistent with the disclosed embodiments. The ASAR ADC circuit may include a sample/hold circuit, a digital-to-analog convertor circuit, a first voltage comparison circuit, a first logic circuit and a pulse generation circuit, etc.

As shown in FIG. 9, the analog-to-digital conversion method may include inputting a first analog signal into the sample/hold circuit and outputting a second analog signal (S101); and inputting a first digital signal into the digital-to-analog converter circuit and outputting a third analog signal (S102). The method may also include responding to a valid level of a latch signal, and comparing the second analog signal with the third analog signal using the first voltage comparison circuit for outputting a first logic level and a second logic level (S103); and responding to a valid level of a flag signal, and identifying a comparison result of the first voltage comparison circuit according to the first logic level and the second logic level using the first logic circuit and outputting a first digital signal (S104). Further, the method may include generating the latch signal and the flag signal using the pulse generation circuit with a generation time of the valid levels of the latch signal and the flag signal being independent of the first logic level and the second logic level (S105).

Thus, the present disclosed ASAR ADC circuit may include a sample/hold circuit, a DAC circuit, a first voltage comparison circuit, a first logic circuit and a pulse generation circuit. The first voltage comparison circuit may respond to the valid level of a latch signal, and compare the input signals from its terminals, and output a first logic level and a second logic level. The first logic circuit may respond to the valid level of the flag signal; and identify the comparison result of the first voltage comparison circuit according to the first logic level and the second logic level; and output a first digital signal. The pulse generation circuit may be configured to generate the latch signal and the flag signal. The generation time of the valid level of the latch signal and the flag signal may be independent of the first logic level and the second logic level.

In the existing ASAR ADC circuit, the flag signal is configured to indicate the comparison circuit finishes the comparison process; and the latch signal outputs the valid level. In the disclosed ASAR ADC circuit, the latch signal and the flag signal may be independent of the comparison result of the first voltage comparison circuit; and may not be affected by the first voltage comparison circuit. By incorporating the flag signal and the latch signal independently generated by the pulse generation circuit, the comparison time of the first voltage comparison circuit may be actively controlled by the pulse generation circuit. When the first voltage comparison circuit encounters a metastable status during the comparison process, the pulse generation circuit may actively control the first voltage comparison circuit to stop the comparison by controlling the time sequences of the flag signal and the latch signal. When the first voltage comparison circuit is at the metastable state, the voltage difference at its input terminals may be relatively small. Thus, that the first voltage comparison circuit terminates the comparison process may not significantly affect the disclosed ASAR ADC circuit. The disclosed embodiments may be able to eliminate the uncomplete comparison issue caused by the metastable state of the comparison circuit. Thus, the resolution of the ASAR ADC circuit may be ensured.

Further, the pulse width of the latch signal may be equal to the sum of the preset second delay time and the first delay time. The first delay time may be equal to the time for the pulse generation circuit to identify if the second voltage comparison circuit finishes the comparison process and the time for identifying the comparison result. The second delay time may be set by the delay circuit. Thus, the disclosed ASAR ADC circuit may be able to flexibly control the time sequence of the latch signal so as to actively intervene the longest comparison time of the first voltage comparison circuit.

Further, the input signals of the second voltage comparison circuit may all be "big signals". For example, the input signals of the second voltage comparison circuit may be the voltage of the power source and one half of the voltage of the power source, respectively. Thus, the comparison of the second voltage comparison circuit may always be at a stable state. In the disclosed embodiments, the comparison delay of the second voltage comparison circuit may be set in the comparison error range of the first voltage comparison circuit, it may further limit the longest comparison time of the first voltage comparison circuit within the preset error range of the delay time of the comparison of the big signals. The comparison of the big signals may be at the stable state. On one hand, it may ensure the first voltage comparison circuit to be able to finish the comparison of the inputted big signals. On the other hand, no excessive time may be left for the inputted small signals. At the same time, the output resolution and the converting speed may be balanced.

Further, the internal structure of the second voltage comparison circuit may be identical to the internal structure of the first voltage comparison circuit; and the internal structure of the second logic circuit may be identical to the internal structure of the first logic circuit. Thus, the disclosed ASAR ADC circuits may be easy to realize; and the production cost may be relatively low. From the control time sequence and the delay time points of view, the synchronization of the disclosed ASAR ADC circuit may be ensured.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An asynchronous successive approximation register analog-to-digital converter (ASAR ADC) circuit, configured to covert a first analog signal into a first digital signal, the ASAR ADC circuit comprising:
   a sample/hold circuit having an input terminal configured as an input terminal of the ASAR ADC to input the first analog signal, and an output terminal configured to output a second analog signal;
   a digital-to-analog converter circuit having an input terminal configured to input the first digital signal, and an output terminal configured to output a third analog signal;
   a first voltage comparison circuit, configured to respond to a valid level of a latch signal, and to compare the second analog signal with the third analog signal respectively inputted into a positive terminal of the first voltage comparison circuit and a negative terminal of the first voltage comparison circuit to output a first logic level and a second logic level;
a first logic circuit, configured to respond to a valid level of a flag signal, and to identify a comparison result of the first voltage comparison circuit according to the first logic level and the second logic level respectively inputted into the first logic circuit to output the first digit signal; and
a pulse generation circuit configured to generate the latch signal and the flag signal with a generation time of the valid levels of the latch signal and the flag signal independently from the first logic level and the second logic level.

2. The ASAR ADC circuit according to claim 1, wherein the pulse generation circuit comprises;
a second voltage comparison circuit, responding to the latch signal, and configured to compare a fourth analog signal and a fifth analog signal respectively inputted into a positive input terminal and a negative input terminal of the second voltage comparison circuit to output a third logic level and a fourth logic level; and
a signal generation circuit configured to generate the latch signal and the flag signal.

3. The ASAR ADC circuit according to claim 2, wherein:
the signal generation circuit is configured to identify the third logic level and the fourth logic level and determine if the second voltage comparison circuit finishes a comparison process;
the flag signal is turned into a valid level when the comparison process is completed;
the signal generation circuit is also configured to identify a comparison result when the second voltage comparison circuit finishes the comparison process;
a sum of time for the signal generation circuit to identify if the second voltage comparison circuit finishes the comparison and time for the signal generation circuit to identify the comparison result of the second voltage comparison circuit is referred to a first delay time;
a signal of the latch signal is a pulse signal; and
a pulse width of the latch signal is a sum of a preset second delay time and the first delay time.

4. The ASAR ADC circuit according to claim 3, wherein:
a comparison delay of the second voltage comparison circuit is within a preset error range of a comparison delay of the first voltage comparison circuit under a same input signal.

5. The ASAR ADC circuit according to claim 4, wherein:
the fourth analog signal and the fifth analog signal are big signals;
an amplitude of the fourth analog signal is equal to a voltage of a power source; and
an amplitude of the fifth analog signal is equal to one half of the voltage of the power source.

6. The method according to claim 3, wherein the signal generation circuits comprises:
a comparison circuit status detection circuit configured to identify the third logic level and the fourth logic level to determine if the second voltage comparison circuit finishes a comparison process and turn the flag signal into a valid level if the comparison process is determined to be finished;
a second logic circuit configured to identify a comparison result of the second voltage comparison circuit when the second voltage comparison circuit finishes the comparison process, and output a first pulse signal when a process for identifying the comparison result is finished; and a delay circuit configured to provide the preset second delay time to the first pulse signal, and output the latch signal.

7. The ASAR ADC circuit according to claim 6, wherein:
the comparison circuit status detection circuit is an Exclusive-Or gate circuit; and
the flag signal outputted from the Exclusive-Or gate circuit is at a logic high level if the third logic level is opposite to the fourth logic high level.

8. The ASAR ADC circuit to claim 6, wherein the delay circuit comprises:
at least one cascade-connected inverter.

9. The ASAR ADC circuit according to claim 1, wherein the first voltage comparison circuit comprises:
a fully differential input/fully differential output comparison circuit.

10. The ASAR ADC circuit according to claim 9, wherein:
an internal structure of the second voltage comparison circuit is identical to an internal structure of the first voltage comparison circuit.

11. The ASAR ADC circuit according to claim 6, wherein:
an internal structure of the second logic circuit is identical to an internal structure of the first logic circuit.

12. A method for converting a analog signal to a digital signal using an asynchronous successive approximation register analog-to-digital converter (ASAR ADC) circuit having a sample/hold circuit, a digital-to-analog convertor circuit, a first voltage comparison circuit, a first logic circuit and a pulse generation circuit, the method comprising:
inputting a first analog signal into the sample/hold circuit and outputting a second analog signal;
inputting a first digital signal into the digital-to-analog converter circuit and outputting a third analog signal;
responding to a valid level of a latch signal, and comparing the second analog signal with the third analog signal using the first voltage comparison circuit for outputting a first logic level and a second logic level;
responding to a valid level of a flag signal, and identifying a comparison result of the first voltage comparison circuit according to the first logic level and the second logic level using the first logic circuit and outputting a first digital signal; and
generating the latch signal and the flag signal using the pulse generation circuit with a generation time of the valid levels of the latch signal and the flag signal being independent of the first logic level and the second logic level.

13. The method according to claim 12, wherein:
the first analog signal is inputted in an input terminal of the sample/hold circuit;
the second analog signal is outputted from an output terminal of the sample/hold circuit;
the first digital signal is inputted in an input terminal of the digital-to-analog converter circuit;
the third analog signal is outputted from an output terminal of the digital-to-analog converter circuit;
the second analog signal is inputted in a positive terminal of the first voltage comparison circuit; and
the third analog signal is inputted in a negative terminal of the first voltage comparison circuit.

14. The method according to claim 12, wherein the pulse generation circuit includes a second voltage comparison circuit and signal generation circuit, wherein:
the signal generation circuit is configured to generate the latch signal and the flag signal.

15. The method according to claim 14, wherein:
- a fourth analog signal and a fifth analog signal are inputted into a positive terminal and a negative terminal of the second voltage comparison circuit, respectively;
- the second voltage comparison circuit responds to the latch signal;
- the second voltage comparison circuit compares the fourth analog signal with the fifth analog signal to output a third logic level and a fourth logic level;
- the signal generation circuit is configured to identify the third logic level and the fourth logic level and determine if the second voltage comparison circuit finishes a comparison process;
- the flag signal is turned into a valid level when the comparison process is finished;
- the signal generation circuit is also configured to identify a comparison result when the second voltage comparison circuit finishes the comparison process;
- a sum of time for the signal generation circuit to identify if the second voltage comparison circuit finishes the comparison process and time for the signal generation circuit to identify the comparison result of the second voltage comparison circuit is referred to as a first delay time;
- a signal of the latch signal is a pulse signal; and
- a pulse width of the latch signal is a sum of a preset second delay time and the first delay time.

16. The method according to claim 15, wherein:
- a comparison delay time of the second voltage comparison circuit is within a preset error range of a comparison delay time of the first voltage comparison circuit under a same input signal.

17. The method according to claim 16, wherein:
- the fourth analog signal and the fifth analog signal are big signals;
- an amplitude of the fourth analog signal is equal to a voltage of a power source; and
- an amplitude of the fifth analog signal is equal to one half of the voltage of the power source.

18. The method according to claim 14, wherein the signal generation circuits comprises a comparison circuit detection circuit, a second logic circuit and a delay circuit, wherein:
- the comparison circuit detection circuit is configured to identify the third logic level and the fourth logic level to determine if the second voltage comparison circuit finishes a comparison process and turn the flag signal into a valid level if the comparison process is determined to be finished;
- the second logic circuit is configured to identify a comparison result of the second voltage comparison circuit when the second voltage comparison circuit finishes the comparison process, and output a first pulse signal when a process for identifying the comparison result is finished; and
- the delay circuit is configured to provide the preset second delay time to the first pulse signal, and output the latch signal.

19. The method according to claim 18, wherein:
- the comparison circuit status detection circuit is an Exclusive-Or gate circuit; and
- the flag signal outputted from the Exclusive-Or gate circuit is at a logic high level if the third logic level is opposite to the fourth logic high level.

20. The method according to claim 19, wherein the delay circuit comprises:
- at least one cascade-connected inverter.

* * * * *